(12) United States Patent
Tsai et al.

(10) Patent No.: US 7,417,369 B2
(45) Date of Patent: Aug. 26, 2008

(54) ORGANIC ELECTROLUMINESCENT DEVICE WITH LIGHT-TRANSMISSIVE OPTICAL COMPENSATION LAYER

(75) Inventors: Tze-Chien Tsai, Sijhih (TW); Che-Jen Chen, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 483 days.

(21) Appl. No.: 11/215,291

(22) Filed: Aug. 30, 2005

(65) Prior Publication Data

US 2006/0181201 A1 Aug. 17, 2006

(30) Foreign Application Priority Data

Feb. 17, 2005 (TW) .............................. 94104604 A

(51) Int. Cl.
*H01J 1/62* (2006.01)
*H01J 63/04* (2006.01)

(52) U.S. Cl. ................. 313/504; 313/498; 313/506; 313/512; 313/110; 313/113

(58) Field of Classification Search ................. 313/498, 313/503, 504, 506, 512, 478, 110, 112, 113
See application file for complete search history.

(56) References Cited

U.S. PATENT DOCUMENTS

| | | | | |
|---|---|---|---|---|
| 5,714,838 | A | 2/1998 | Haight et al. ............... 313/506 |
| 6,259,423 | B1* | 7/2001 | Tokito et al. ................ 345/76 |
| 6,366,017 | B1* | 4/2002 | Antoniadis et al. .......... 313/506 |
| 6,433,355 | B1* | 8/2002 | Riess et al. ................. 257/40 |
| 6,621,840 | B2* | 9/2003 | Araki ........................ 372/39 |
| 6,831,407 | B2 | 12/2004 | Cok ........................... 313/504 |
| 6,917,159 | B2* | 7/2005 | Tyan et al. .................. 313/506 |
| 7,187,116 | B2 | 3/2007 | Lee |
| 2002/0176992 | A1* | 11/2002 | Parthasarathy et al. ... 428/411.1 |
| 2003/0127973 | A1* | 7/2003 | Weaver et al. .............. 313/504 |
| 2004/0069995 | A1 | 4/2004 | Magno et al. |
| 2004/0140758 | A1* | 7/2004 | Raychaudhuri et al. ..... 313/504 |
| 2004/0195965 | A1* | 10/2004 | Yamazaki et al. ........... 313/506 |
| 2005/0025995 | A1* | 2/2005 | Cheng et al. ................ 428/690 |
| 2006/0066228 | A1* | 3/2006 | Antoniadis et al. ......... 313/506 |
| 2006/0158098 | A1* | 7/2006 | Raychaudhuri et al. ..... 313/503 |

FOREIGN PATENT DOCUMENTS

CN 1578567 2/2005

OTHER PUBLICATIONS

China Office Action mailed Sep. 21, 2007.

* cited by examiner

*Primary Examiner*—Joseph L. Williams
*Assistant Examiner*—Kevin Quarterman
(74) *Attorney, Agent, or Firm*—Thomas, Kayden, Horstemeyer & Risley

(57) ABSTRACT

An organic electroluminescent device, a flat panel display, and a portable electronic device using the same are disclosed. The organic electroluminescent device comprises a substrate, a transparent anode disposed on the substrate, a transparent cathode disposed opposite the transparent anode, and an organic light emitting layer interposed between the transparent anode and the transparent cathode. The organic electroluminescent device further comprises a first light transmissive optical compensation layer interposed between the transparent anode and the substrate, wherein the first light transmissive optical compensation layer is substantially made of a transition metal oxide.

13 Claims, 9 Drawing Sheets

ORGANIC ELECTROLUMINESCENT DEVICE WITH LIGHT-TRANSMISSIVE OPTICAL COMPENSATION LAYER

BACKGROUND

The present invention relates to an organic electroluminescent device and, more particularly, to an organic electroluminescent device (OELD) having an optical compensation layer disposed on the transparent anode or the transparent cathode, a flat panel display and a portable electronic device using the same.

Organic electroluminescent devices can be fabricated without a backlight module as compared to liquid crystal displays thus simplifying the manufacturing process thereof. They have been rapidly developed and used in a variety of electronic devices, especially portable electronic devices such as mobile phones, game machines, video cameras, digital image reproduction apparatuses, DVD players, a personal digital assistants, or laptop computers. One of the main development issues of organic electroluminescent devices is to improve brightness, luminescence efficiency to reduce power consumption and extend product life.

U.S. Pat. No. 5,714,838 to Haight et al. discloses a top emission type organic electroluminescent device. A Calcium film or a Calcium alloy film is interposed between a transparent electrode (ZnS, GaN, ITO) and a light emitting layer in order to prevent diffusion of the compounds of the transparent electrode into the organic light emitting layer. However, the Ca film or the Ca alloy may reduce the luminescence efficiency of the organic electroluminescent device.

U.S. Pat. No. 6,831,407 to Cok discloses an organic light emitting diode. A topographical feature is located within the light emitting area to disrupt the waveguiding, whereby the light emitting efficiency of the light emitting area is improved. However, the process of the organic light emitting diode becomes relatively complex.

Therefore, there is a need to provide an organic electroluminescent device capable of improving the luminescence efficiency and simplifying the manufacturing process.

SUMMARY

An object of the present invention is to provide an organic electroluminescent device using at least one optical compensation layer to produce construction interference for improving luminescence efficiency and improve color shift at the viewing angle.

Another object of the present invention is to provide an organic electroluminescent device with improve the luminescence efficiency. The organic electroluminescent device includes an optical compensation layer, single or multiple a transition metal oxides, formed on a transparent anode and/or a transparent cathode by evaporation without a complex manufacturing process.

An organic electroluminescent device is provided. An embodiment of the organic electroluminescent device comprises a substrate, a transparent anode disposed on the substrate, a transparent cathode disposed opposite the transparent anode, and an organic light emitting layer interposed between the transparent anode and the transparent cathode. The organic electroluminescent device further comprises a first light transmissive optical compensation layer interposed between the transparent anode and the substrate, wherein the first light transmissive optical compensation layer is substantially made of a transition metal oxide.

The organic electroluminescent device may further comprise a second light transmissive optical compensation layer disposed on the transparent cathode, wherein the second light transmissive optical compensation layer is substantially made of a transition metal oxide.

A flat panel display and a portable electronic device using the same are also disclosed.

DESCRIPTION OF THE DRAWINGS

An organic electroluminescent device will become more fully understood from the detailed description given herein below and the accompanying drawings, given by way of illustration only and thus not intended to be limitative of the invention.

DETAILED DESCRIPTION

Figure 1:
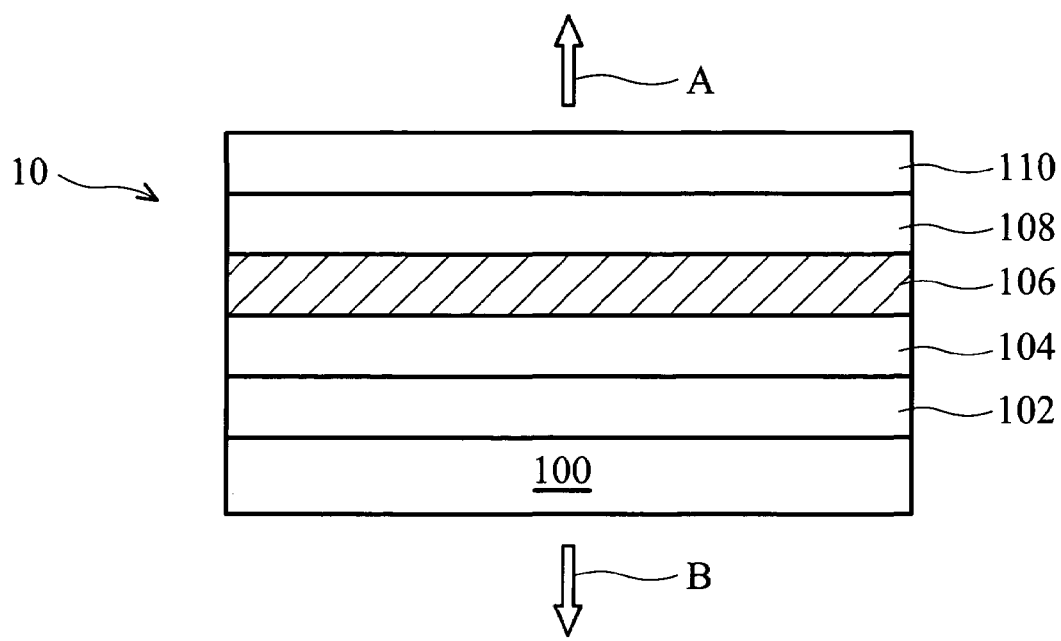
FIG. 1 is a cross section of an organic electroluminescent device with an optical compensation layer according to a first embodiment of the present invention.

FIG. 1 illustrates a first embodiment of the organic electroluminescent device 10. The organic electroluminescent device 10 includes a substrate 100, a transparent anode 104 and a transparent cathode 108 disposed opposite the transparent anode 104. The substrate 100 may comprises a glass material, quartz, or a plastic material. The organic electroluminescent device 10 further comprises an organic light emitting layer 106 interposed between and directly contacting the transparent anode 104 and the transparent cathode 108. The organic electroluminescent device 10 further includes a first light transmissive optical compensation layer 102 and a second light transmissive optical compensation layer 110 disposed on the transparent cathode 108. The first light transmissive optical compensation layer 102 is interposed between the substrate 100 and the transparent anode 104. The first light transmissive optical compensation layer 102 may comprise a transition metal oxide such as $TiO_2$, $WO_3$, $Ta_2O_5$, $V_2O_5$, ZnO, ZrO, $CeO_2$, $Nb_2O_5$, $Gd_2O_3$, $Cr_2O_3$, NiO, $Bi_2O_3$, SmO, $Nd_2O_5$, or the combinations thereof. The thickness of the first light transmissive optical compensation layer 102 is substantially less than about 10,000 Å, and preferably ranges from about 500 Å to about 1000 Å. The first light transmissive optical compensation layer 102 may have a complex index of refraction N=n–ik, where n is an index of refraction substantially less than or equal to about 3.5, k is an extinction coefficient substantially less than or equal to about 0.2 at a wavelength of about 380 nm to about 780 nm and i is an imaginary number. The thickness, material, or optical property of the second light transmissive optical compensation layer 110 is substantially identically as that of the first light transmissive optical compensation layer 102.

The manufacturing process of the organic electroluminescent device 10 is described in the following. The first light transmissive optical compensation layer 102, the transparent anode 104, the organic light emitting layer 106, the transparent cathode 108, and the second light transmissive optical compensation layer 110 are sequentially formed on the substrate 100. Note that both the first and the second light transmissive optical compensation layers 102, and 110 are preferably formed by E-beam deposition, thermal evaporation, molecular beam epitaxy, vapor phase epitaxy, or metal organic chemical vapor deposition.

Figure 4:
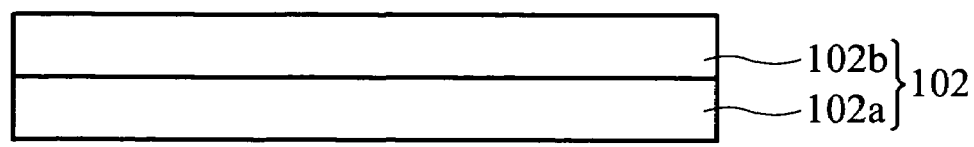
FIG. 4 is a cross section of an embodiment of a multiple-layered optical compensation layer of the present invention.
Figures 5, 6:
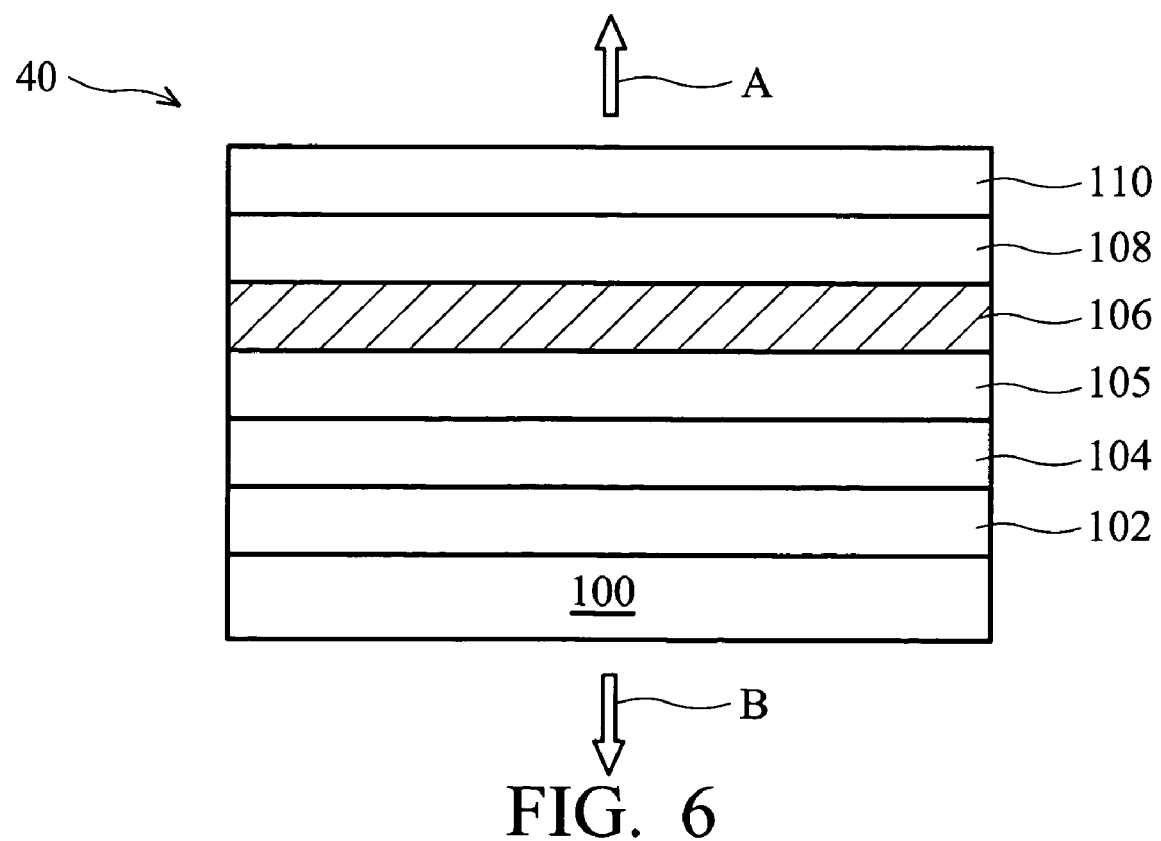
FIG. 5 is a cross section of an embodiment of a single-layered optical compensation layer of the present invention.
FIG. 6 is a cross section of an organic electroluminescent device with an optical compensation layer according to a fourth embodiment of the present invention.

In some embodiments of the present invention, the first light transmissive optical compensation layer 102 disposed on the substrate 100 includes a bottom optical compensation layer 102a and a top optical compensation layer 102b as shown in FIG. 4. Alternately, the first light transmissive optical compensation layer 102 is a single layer as shown in FIG. 5. The first light transmissive optical compensation layer 102 of the present invention is not limited to one or two layers, it may have more than two layers. Moreover, the thickness of the top optical compensation layer 102b and the thickness of the bottom optical compensation layer 102 ranges from about 500 Å to about 1,000 Å, respectively, preferably ranges from about 700 Å to about 900 Å. The second light transmissive optical compensation layer 110 may also be a single layer, a double layer, or multiple layers.

The transparent anode 104 may comprise a transparent conductive material such as indium tin oxide (ITO) or indium zinc oxide (IZO). The thickness of the transparent anode 104 ranges from about 700 Å to about 800 Å. The transparent cathode 108 may comprise a transparent conductive material such as about 700 Å to about 800 Å of indium tin oxide (ITO) or indium zinc oxide (IZO) or about 50 Å of aluminum.

The organic light emitting layer 106 may comprise Tris (8-hydroxyquinoline) aluminum III (Alq3). When a forward bias voltage generated by a DC power supply is applied to the organic electroluminescent device 10, electrons and holes are injected into the organic light emitting layer 106 through the transparent cathode 108 and the transparent anode 104 respectively. Therefore, the chemical compounds of the organic light emitting layer 106 are excited by energy thereby producing fluorescence or phosphorescence and radiating toward the emission direction A (the direction of an arrow as shown in FIG. 1) passing through the transparent anode 104, the first light transmissive optical compensation layer 102 and substrate 100. On the other hand, fluorescence or phosphorescence generated from the organic light emitting layer 106 also radiates toward emission direction B (the direction of an arrow as shown in FIG. 1) passing through the transparent cathode 108 and the second light transmissive optical compensation layer 110. That is, one embodiment of the present invention is a double emission organic electroluminescent device capable of top emission (direction A) and bottom emission (direction B).

Figure 2:
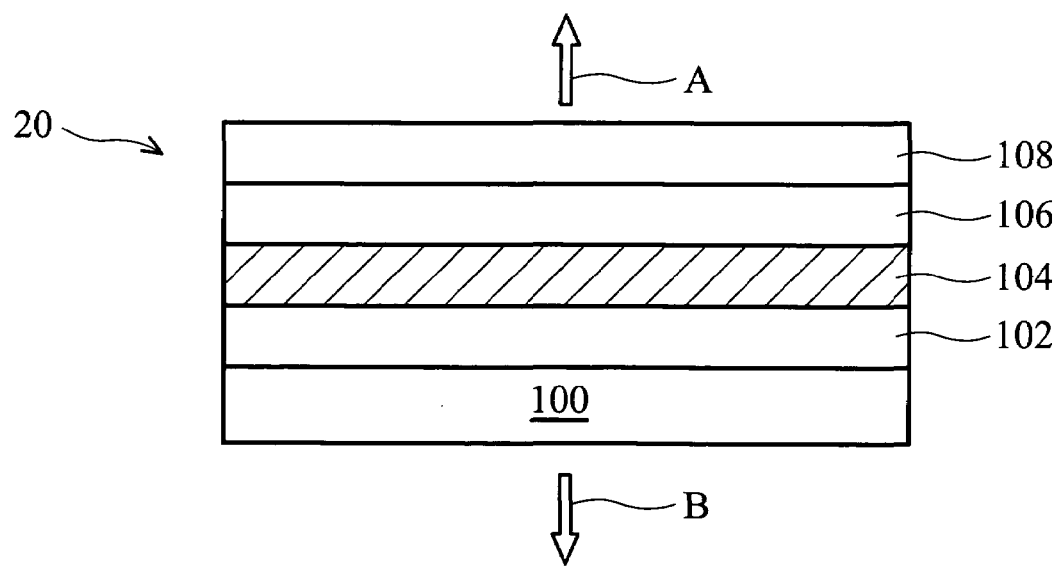
FIG. 2 is a cross section of an organic electroluminescent device with an optical compensation layer according to a second embodiment of the present invention.

Next, FIG. 2 shows a cross section of an organic electroluminescent device 20 with an optical compensation layer according to a second embodiment of the present invention. The organic electroluminescent device 20 includes a first light transmissive optical compensation layer 102, a transparent anode 104, an organic light emitting layer 106 and a transparent cathode 108 sequentially formed on a substrate 100. The device 20 is substantially similar to the organic electroluminescent device 10 of a first embodiment except for the lack of the second light transmissive optical compensation layer 110 mentioned in a first embodiment.

Figure 3:
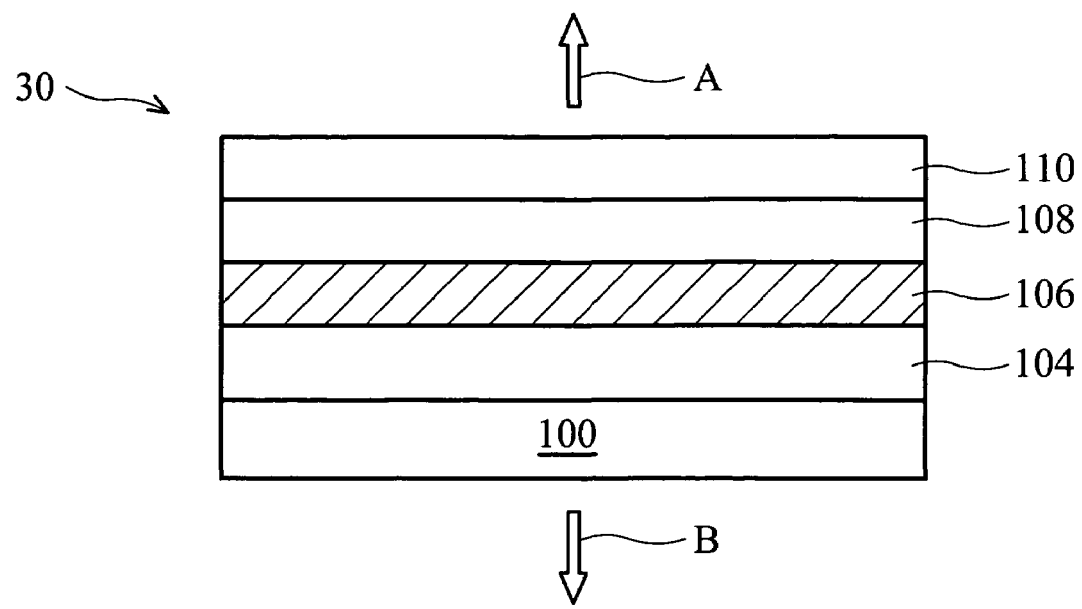
FIG. 3 is a cross section of an organic electroluminescent device with an optical compensation layer according to a third embodiment of the present invention.

FIG. 3 shows a cross section of an organic electroluminescent device 30 with an optical compensation layer according to a third embodiment of the present invention. The organic electroluminescent device 30 includes a transparent anode 104, an organic light emitting layer 106, a transparent cathode 108 and a second light transmissive optical compensation layer 110 sequentially formed on a substrate 100. The device 30 is substantially similar to the organic electroluminescent device 10 of a first embodiment except for the lack of the first light transmissive optical compensation layer 102 mentioned in a first embodiment.

FIG. 6 shows a cross section of an organic electroluminescent device 40 with an optical compensation layer according to a fourth embodiment of the present invention. The organic electroluminescent device 40 includes a first light transmissive optical compensation layer 102, a transparent anode 104, an organic light emitting layer 106, a transparent cathode 108 and a second light transmissive optical compensation layer 110 sequentially formed on a substrate 100. The device 40 is substantially similar to the organic electroluminescent device 10 of a first embodiment except for the addition of a high molecular conductive layer 105, serving as a hole injection layer, between the transparent anode 104 and the organic light emitting layer 106. The high molecular conductive layer 105 may comprise a mixture composed of polystyrene dioxythiophene (PEDT) or polysterene sulphonate (PSS). The organic light emitting layer 106 may comprise poly(p-phenylene vinylene) (PPV).

Figure 7:
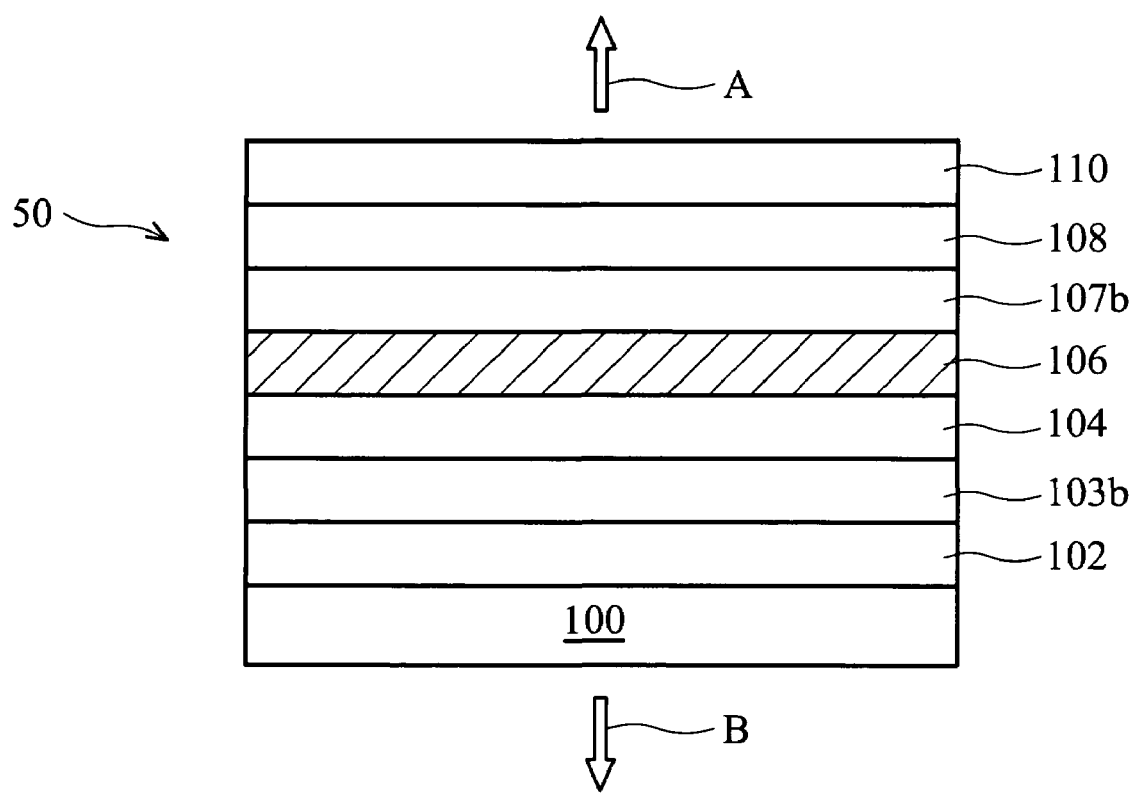
FIG. 7 is a cross section of an organic electroluminescent device with an optical compensation layer according to a fifth embodiment of the present invention.

FIG. 7 shows a cross section of an organic electroluminescent device 50 with an optical compensation layer according to a fifth embodiment of the present invention. The organic electroluminescent device 50 includes a first light transmissive optical compensation layer 102, a transparent anode 104, an organic light emitting layer 106, a transparent cathode 108 and a second light transmissive optical compensation layer 110 sequentially formed on a substrate 100. The device 50 is substantially similar to the organic electroluminescent device 10 mentioned in a first embodiment except for adding a hole transport layer 103b of naphtha-phenyl benzidine (NPB) and an electron transport layer 107b of Alq3.

Figure 8:
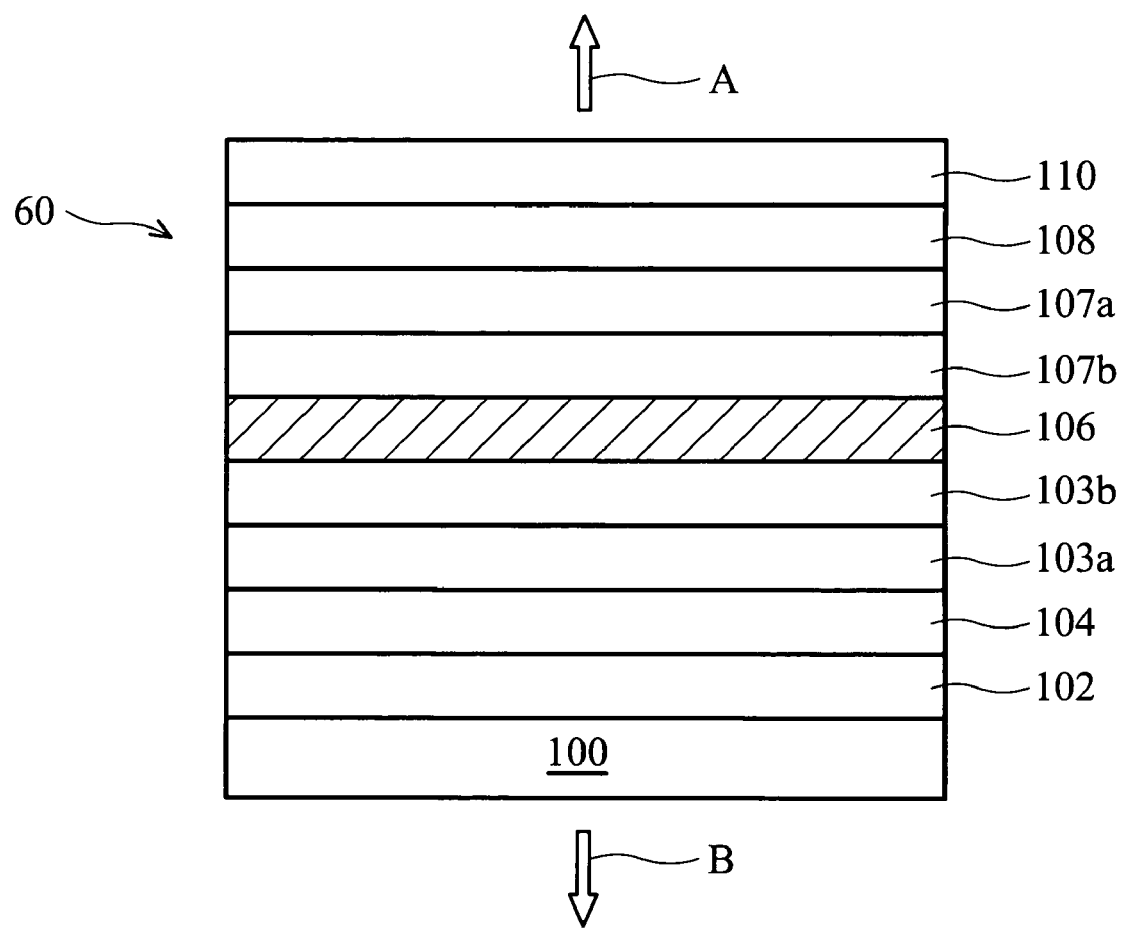
FIG. 8 is a cross section of an organic electroluminescent device with an optical compensation layer according to a sixth embodiment of the present invention.

FIG. 8 shows a cross section of an organic electroluminescent device 60 with an optical compensation layer according to a sixth embodiment of the present invention. The organic electroluminescent device 60 includes a first light transmissive optical compensation layer 102, a transparent anode 104, an organic light emitting layer 106, a transparent cathode 108, a second light transmissive optical compensation layer 110 sequentially formed on a substrate 100. The device 60 is substantially similar to the organic electroluminescent device 50 except for the addition of a hole injection layer 103a of copper phthalocyanine (CuPc) and an electron injection layer 107a of LiF film.

At least one optical compensation layer is disposed on the transparent anode 104 and/or the transparent cathode 108 next to the light-out side of the organic electroluminescent device thus the luminescence efficiency thereof can be improved and the color shift at the viewing angle of the organic electroluminescent device can be improved.

Figure 9:
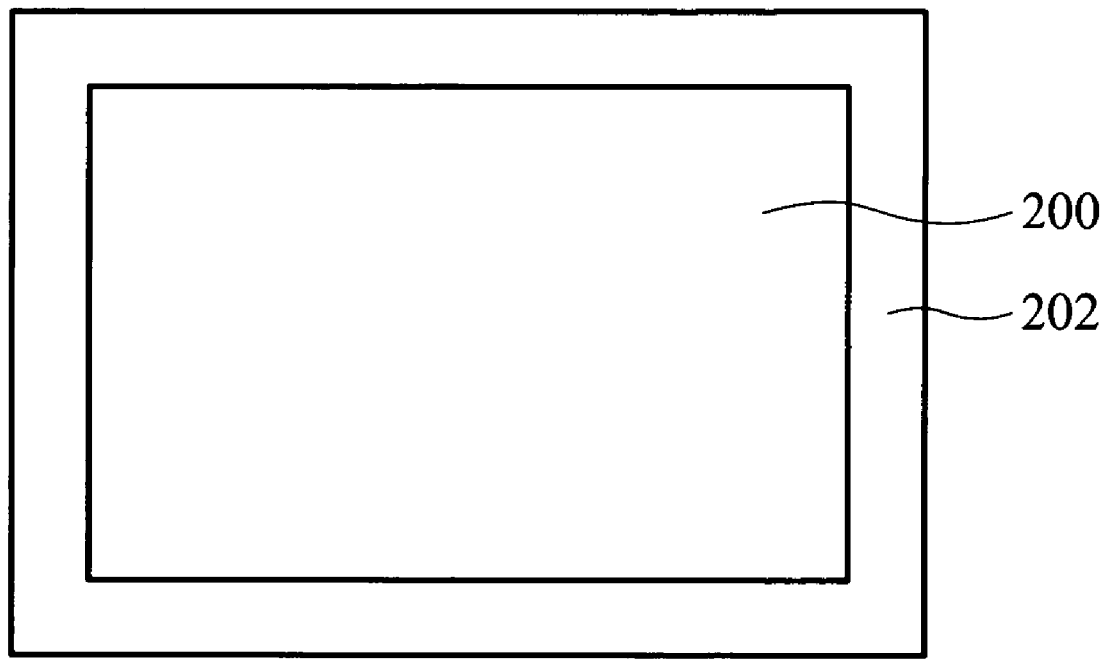
FIG. 9 shows a flat panel display according to an embodiment of the invention.

FIG. 9 shows an embodiment flat panel display. The flat panel display includes an organic electroluminescent device 200 according to of the present invention and a peripheral element 202 such as an outer frame and an external circuit.

Figure 10A:
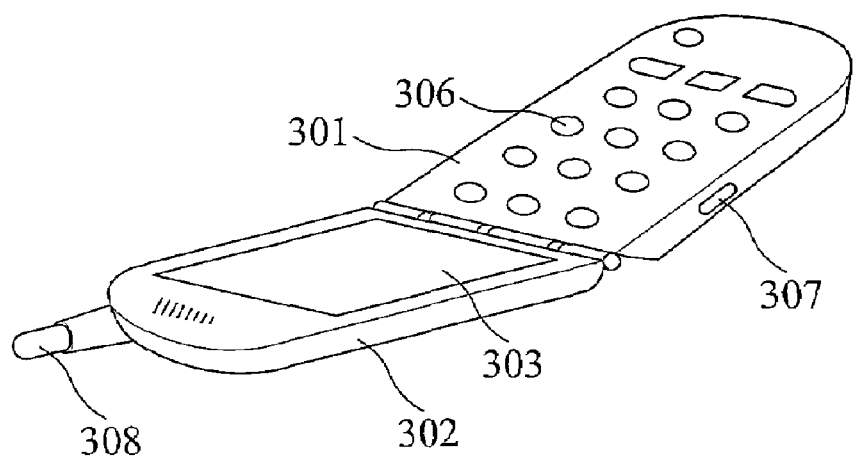
FIG. 10a shows a mobile phone with the organic electroluminescent device of the present invention.

The portable electronic devices are described herein below. FIG. 10a shows a mobile phone with the organic electroluminescent device of the present invention. The mobile phone includes a main body 301, a housing 302, a display area 303 of the organic electroluminescent device, an operation key 306, an external connecting port 307 and an antenna 308.

Figure 10B:
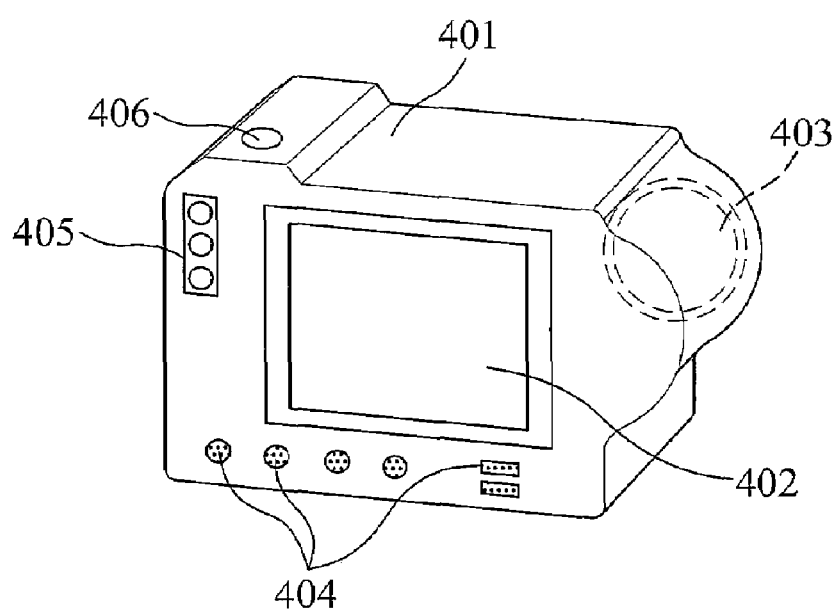
FIG. 10b shows a digital camera with the organic electroluminescent device of the present invention.

FIG. 10b shows a digital camera with the organic electroluminescent device of the present invention. The digital camera includes a main body 401, a display area 402 of the organic electroluminescent device, an image receiving portion 403, an operation key 404, an external connection port 405, and a shutter 406.

Figure 10C:
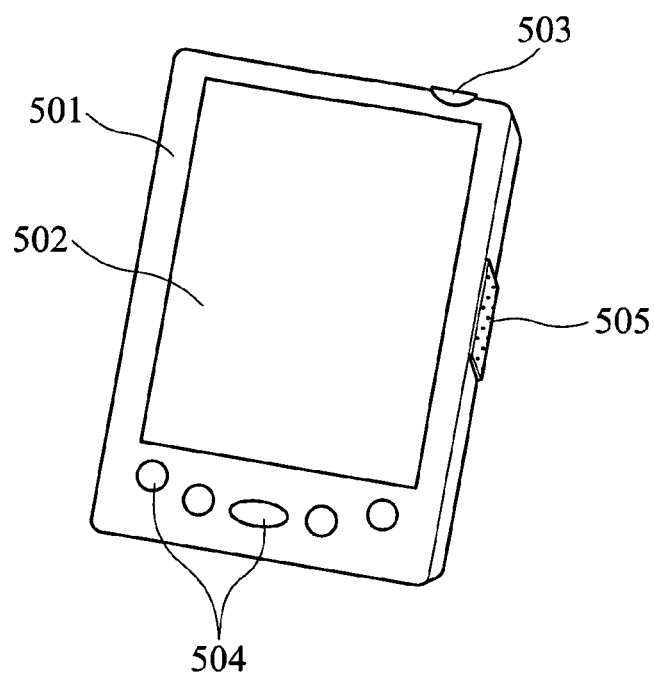
FIG. 10c shows a personal digital assistant with the organic electroluminescent device of the present invention.

FIG. 10c shows a personal digital assistant (PDA) with the organic electroluminescent device of the present invention. The PDA includes a main body 501, a display area 502 of the organic electroluminescent device, a power switch 503, an operation connection portion 504 and an infrared port 505.

Figure 10D:
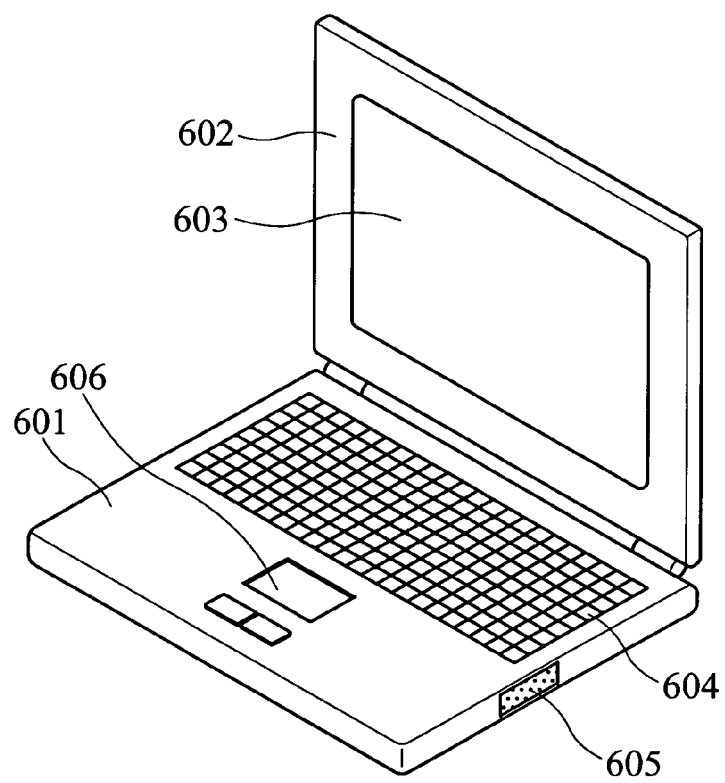
FIG. 10d shows a laptop computer with the organic electroluminescent device of the present invention.

FIG. 10d shows a laptop computer with the organic electroluminescent device of the present invention. The laptop computer includes a main body 601, a housing 602, a display area 603 of organic electroluminescent device, operation key 604, an external connection portion 605, and a pointing mouse 606.

Figure 10E:
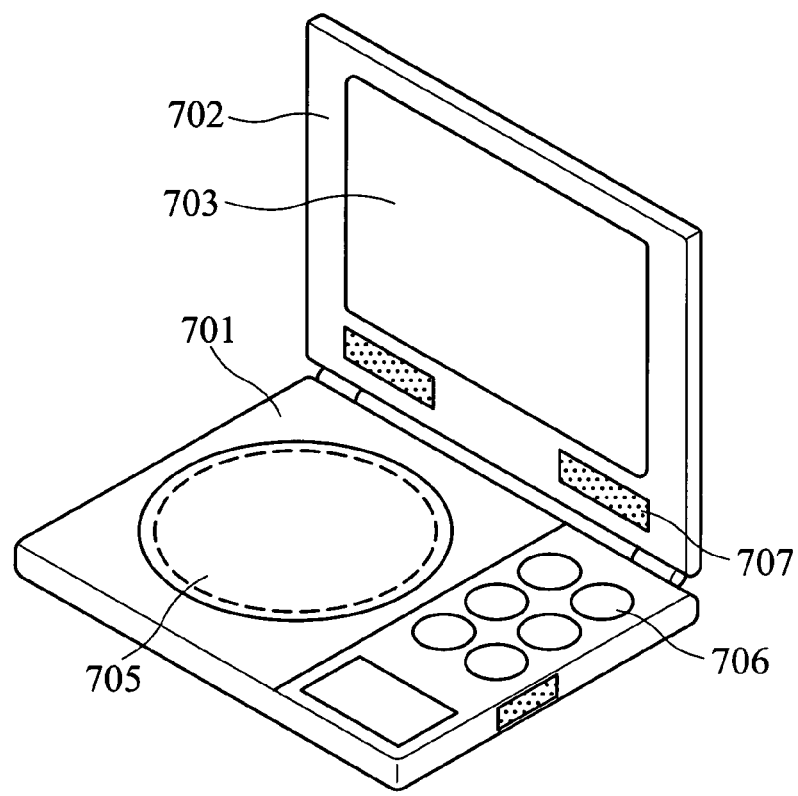
FIG. 10e shows a DVD player with the organic electroluminescent device of the present invention.

FIG. 10e shows a DVD player with the organic electroluminescent device of the present invention. The DVD player includes an image reproduction apparatus including a recording medium (more specifically, a DVD reproduction apparatus), which includes a main body 701, casing 702, a display area 703 of the organic electroluminescent device a recording medium (DVD or the like) reading portion 705, an operation key 706, and a speaker portion 707.

Figure 10F:
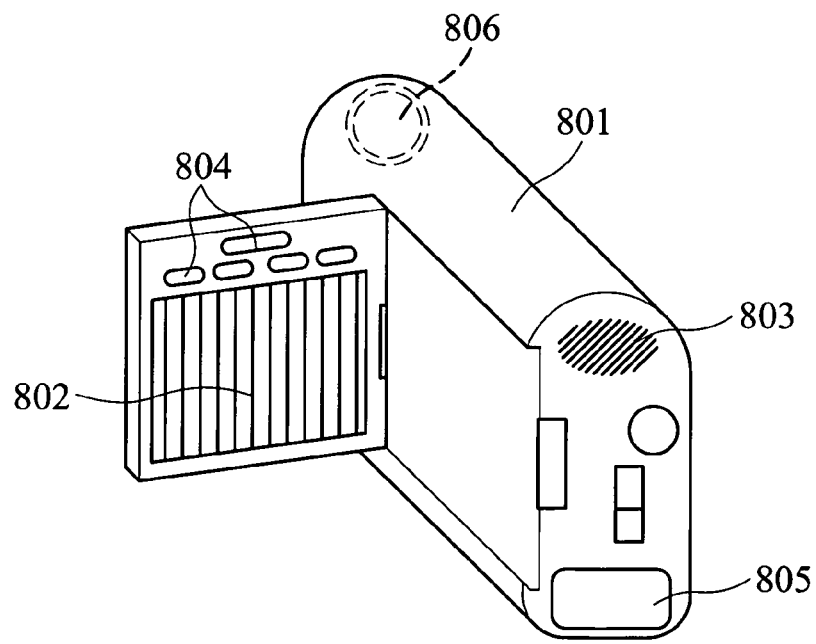
FIG. 10f shows a video camera with the organic electroluminescent device of the present invention.

FIG. 10f shows a video camera with the organic electroluminescent device of the present invention. The video camera includes a main body 801, a display area 802 of the organic electroluminescent device, a sound input portion 803, an operation key 804, a battery 805 and an image receiving portion 806.

While the present invention has been described by way of example and in terms of preferred embodiment, it is to be understood that the present invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An organic electroluminescent device (OELD), comprising:
a substrate;
a transparent anode disposed on the substrate;
a transparent cathode disposed opposite the transparent anode;
an organic light emitting layer interposed between the transparent anode and the transparent cathode;
a first light transmissive optical compensation layer interposed between the transparent anode and the substrate; and
a second light transmissive optical compensation layer disposed on the transparent cathode, wherein at least one of the first light transmissive optical compensation layer and the second light transmissive optical compensation layer comprises $WO_3$, $Ta_2O_3$, $V_2O_5$, $CeO_2$, $Nb_2O_5$, $Gd_2O_3$, $Cr_2O_3$, NiO, $Bi_2O_3$, SmO, $Nd_2O_5$ or combinations thereof.

2. The OELD of claim 1, wherein at least one of the first light transmissive optical compensation layer and the second light transmissive optical compensation layer has a complex index of refraction $N=n-ik$, where n is an index of refraction less than or equal to about 3.5, k is an extinction coefficient less than or equal to about 0.2 at a wavelength of about 380 nm to about 780 nm, and i is an imaginary number.

3. The OELD of claim 1, wherein at least one of the first light transmissive optical compensation layer and the second light transmissive optical compensation layer comprises a single layer.

4. The OELD of claim 1, wherein at least one of the first light transmissive optical compensation layer and the second light transmissive optical compensation layer comprises multiple layers.

5. The OELD of claim 1, wherein at least one of the thickness of the first light transmissive optical compensation layer and the thickness of the second light transmissive optical compensation layer is less than about 10,000 Å.

6. The OELD of claim 1, wherein at least one of the thickness of the first light transmissive optical compensation layer and the thickness of the second light transmissive optical compensation layer ranges from about 500 Å to about 1,000 Å.

7. The OELD of claim 1, wherein the transparent anode comprises ITO or IZO.

8. The OELD of claim 1, wherein the transparent cathode comprises ITO or IZO.

9. The OELD of claim 1, further comprising a hole injection layer interposed between the transparent anode and the organic light emitting layer.

10. The OELD of claim 1, further comprising:
an electron transport layer disposed adjacent to the transparent cathode; and
a hole transport layer disposed adjacent to the transparent anode.

11. The OELD of claim 1, wherein at least one of the first light transmissive optical compensation layer and the second light transmissive optical compensation layer is formed by E-beam deposition, thermal evaporation, molecular beam epitaxy, vapor phase epitaxy, or metal organic chemical vapor deposition.

12. A flat panel display comprising an organic electroluminescent device of claim 1.

13. A portable electronic device comprising an organic electroluminescent device of claim 1.

* * * * *